(12) United States Patent
Maciejewski et al.

(10) Patent No.: US 7,227,204 B2
(45) Date of Patent: Jun. 5, 2007

(54) STRUCTURE FOR IMPROVED DIODE IDEALITY

(75) Inventors: Edward P. Maciejewski, Wappingers Falls, NY (US); Sherry A. Womack, Concord, NH (US); Shreesh Narasimha, Beacon, NY (US); Christopher D. Sheraw, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 10/906,366

(22) Filed: Feb. 16, 2005

(65) Prior Publication Data

US 2006/0180868 A1    Aug. 17, 2006

(51) Int. Cl.
| | |
|---|---|
| H01L 29/76 | (2006.01) |
| H01L 31/119 | (2006.01) |
| H01L 23/58 | (2006.01) |
| H01L 29/861 | (2006.01) |
| H01L 29/00 | (2006.01) |

(52) U.S. Cl. .................. 257/288; 257/212; 257/603; 257/551

(58) Field of Classification Search ............ 257/288, 257/212, 603, 551
See application file for complete search history.

(56) References Cited

U.S. PATENT DOCUMENTS

| | | | |
|---|---|---|---|
| 4,899,202 A * | 2/1990 | Blake et al. ............ 257/336 |
| 5,382,818 A | 1/1995 | Pein | |
| 5,629,544 A | 5/1997 | Voldman et al. | |
| 5,786,616 A | 7/1998 | Fukumoto et al. | |
| 6,051,874 A | 4/2000 | Masuda | |
| 6,100,153 A | 8/2000 | Nowak et al. | |
| 6,103,564 A | 8/2000 | Masuda | |
| 6,242,763 B1 | 6/2001 | Chen et al. | |
| 6,249,029 B1 | 6/2001 | Bryant et al. | |
| 6,255,694 B1 | 7/2001 | Mandelman et al. | |
| 6,291,325 B1 | 9/2001 | Hsu | |
| 6,303,414 B1 | 10/2001 | Ang et al. | |
| 6,429,482 B1 | 8/2002 | Culp et al. | |
| 6,692,998 B2 | 2/2004 | Maciejewski et al. | |
| 6,898,060 B2 * | 5/2005 | Juliano et al. ............ 361/56 |

* cited by examiner

Primary Examiner—Sara Crane
Assistant Examiner—Samuel A. Gebremariam
(74) Attorney, Agent, or Firm—Lisa U. Jaklitsch

(57) ABSTRACT

A device is provided which includes a single-crystal semiconductor region disposed in a substrate. The single-crystal region includes a first semiconductor material and a diode disposed in the single-crystal region. The diode includes an anode region including a first alloy region, being an alloy of the first semiconductor material with a second semiconductor material, and a second region which consists essentially of the first semiconductor material, the diode further including a cathode region.

4 Claims, 5 Drawing Sheets

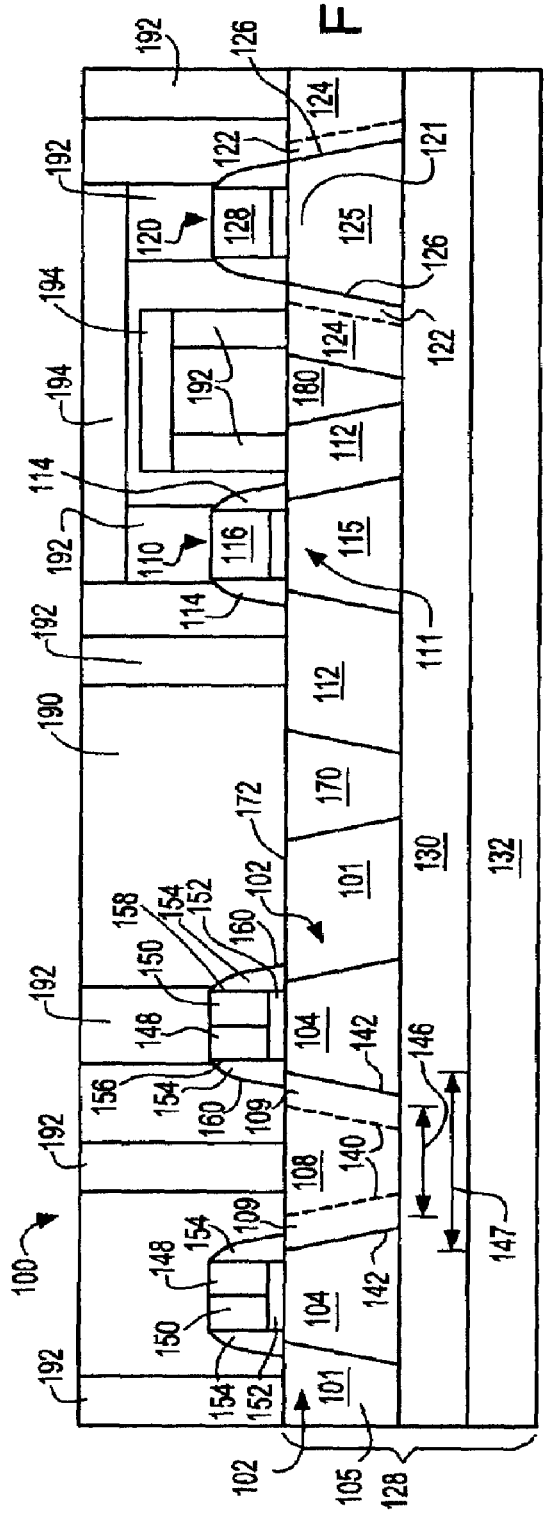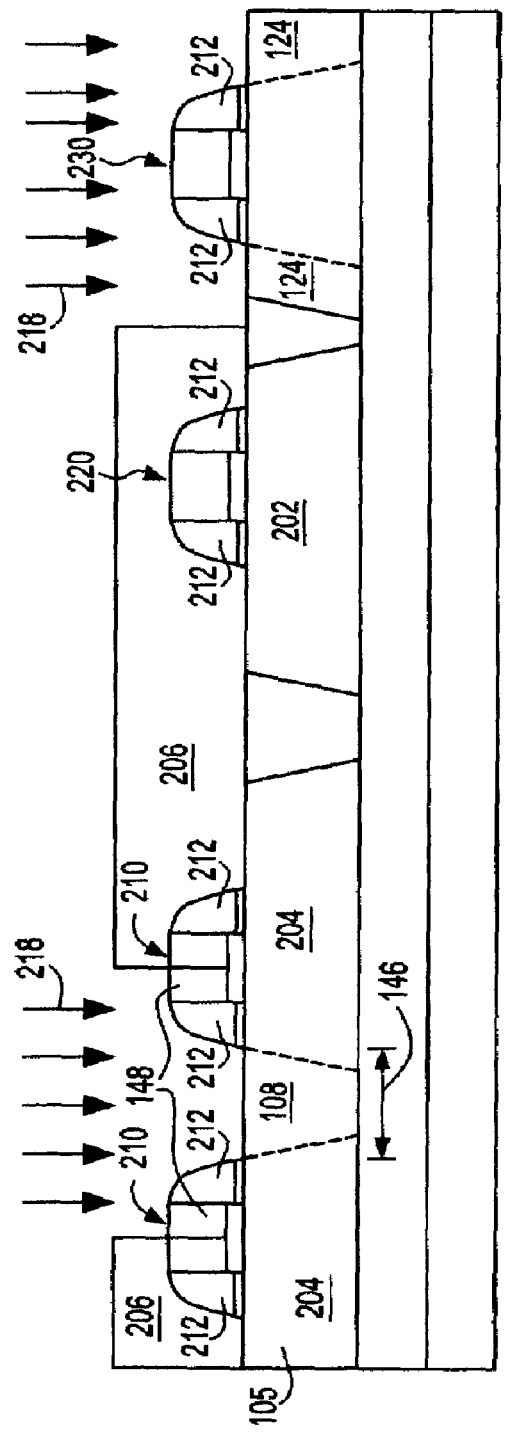

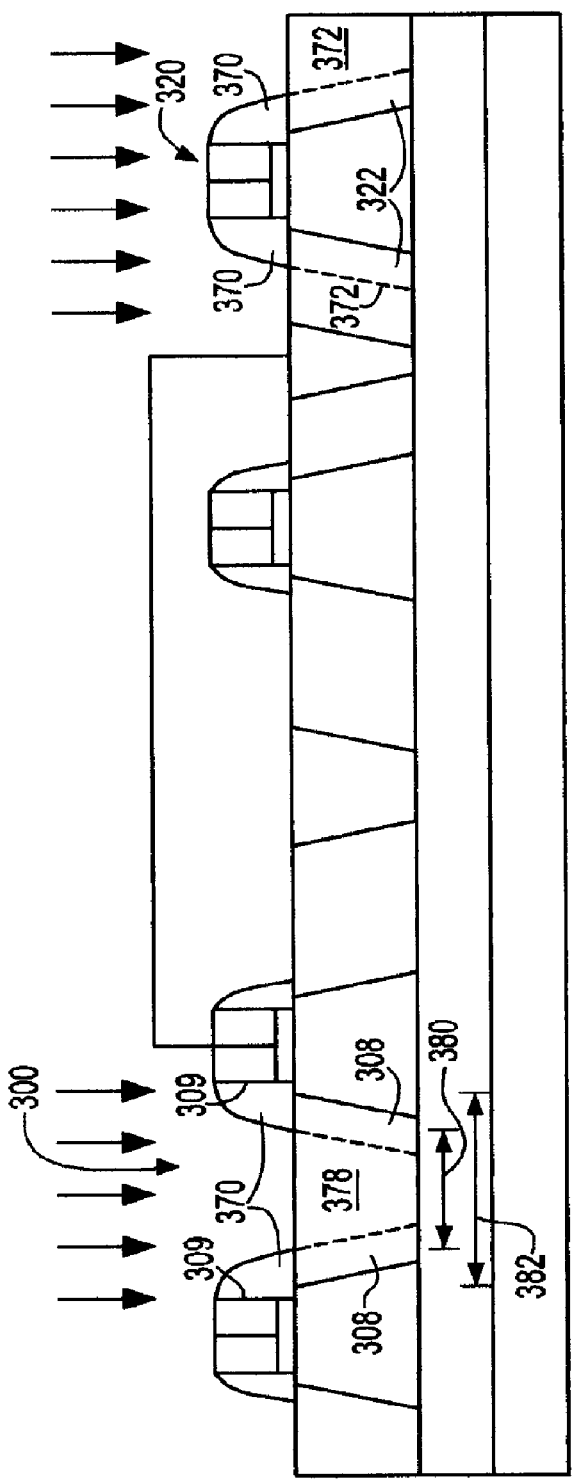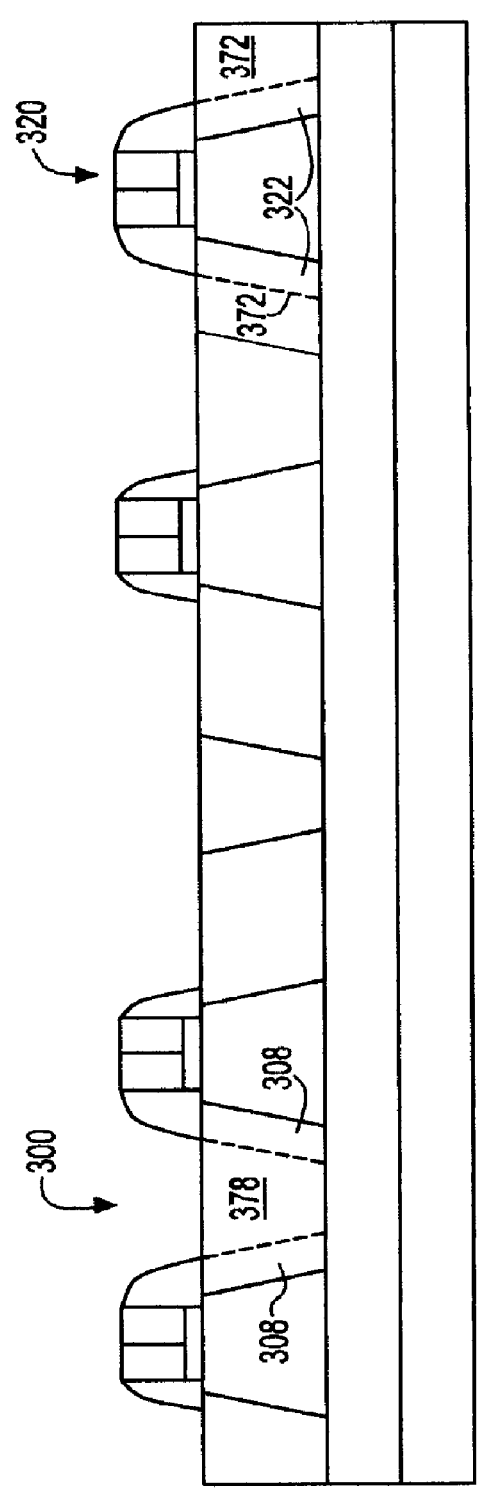

STRUCTURE FOR IMPROVED DIODE IDEALITY

BACKGROUND OF THE INVENTION

The present invention relates to the structure and fabrication of semiconductor devices, and more particularly to the structure and fabrication of diodes and field effect transistors of integrated circuits.

Diodes are frequently used in integrated circuits such as those provided in complementary metal oxide semiconductor (CMOS) circuits which utilize n-type and p-type field effect transistors, i.e., NFETs and PFETs, as basic circuit elements. Diodes are used for numerous applications including sensing temperature and for providing precision voltage references such as bandgap reference circuits. In many applications, diodes are required to have an ideality which is close to unity.

In many processing sequences used to fabricate transistors in CMOS technology, pre-amorphization implants (PAI) are utilized prior to performing implants to form extension and/or source/drain regions. The PAI can be performed using a variety of different species, germanium (Ge), silicon (Si) and xenon (Xe) being examples. PAIs create end-of-range (EOR) defects in the silicon which can be beneficial in forming FETs in certain applications, especially for countering floating body effects in silicon-on-insulator (SOI) transistor technology. However, EOR defects are incompatible with retaining high diode ideality. As a result, CMOS processing sequences need a specialized process flow which is simultaneously required to produce both optimized FETs and high diode ideality.

One example of a diode according to the prior art is illustrated in a sectional view in FIG. 1. The diode shown in FIG. 1 is suitable for fabrication on a CMOS integrated circuit. The diode is fabricated by steps in which PFETs and NFETs of the chip are formed simultaneously. Processing steps that are used to form the NFETs and the PFETs of the integrated circuit are also utilized to form the diode. This results in the diodes having structures similar to gate conductors of FETs, such structures appearing to incorporate half of a gate conductor of a PFET and half of a gate conductor of an NFET. On one half of the gate conductor structure 14, the NFET half, thin spacers 16 are disposed. As particularly shown in FIG. 1, the location of the anode 10 is determined by thick spacers 12 which are disposed on sidewalls of the PFET half of the gate conductor structure 14. The thick spacers of the diode are provided in regions where a p-type dopant is implanted (the anode). This results because the same design level is used to form p-doped regions of PFETs and PFETs require thick spacers for design reasons.

SUMMARY OF THE INVENTION

According to an aspect of the invention, a method is provided for fabricating a diode, the method including providing a cathode region in a single-crystal region of a substrate, wherein the single-crystal region includes a first semiconductor material. A gate stack is formed overlying the single-crystal region, the gate stack including a gate dielectric, a gate conductor overlying the gate dielectric, and at least a first spacer having a first thickness disposed on a sidewall of the gate conductor. The method further includes implanting an exposed region of the single-crystal region of the substrate not masked by the gate stack and the first spacer, a second semiconductor material being implanted into the exposed region. Thereafter, the first spacer is reduced from a first thickness to a second thickness to increase a size of the exposed region. The exposed region having the increased size is then implanted with an anode dopant, and annealing is performed to form a p-n junction at an interface between the region implanted with the anode dopant and the cathode region, wherein the p-n junction is spaced apart from the region that is implanted with the second semiconductor material.

According to other aspects of the invention, other methods of forming such diodes, and methods are provided for simultaneously forming diodes and n-type and p-type field effect transistors.

BRIEF DESCRIPTION OF THE DRAWINGS

FIGS. 2–5 are sectional views illustrating stages in fabrication of an integrated circuit diode according to one embodiment of the invention.

FIGS. 6–9 are sectional views illustrating stages in fabrication of an integrated circuit diode according to a second embodiment of the invention.

DETAILED DESCRIPTION

Figure 1:
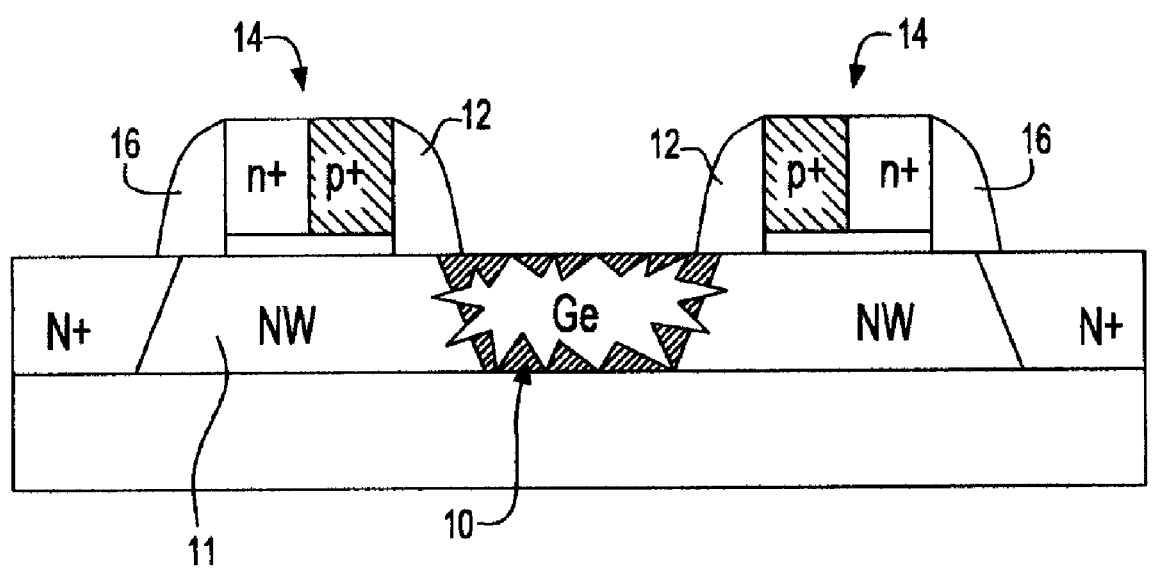
FIG. 1 is a sectional view illustrating an integrated circuit diode according to the prior art.

The embodiments of the invention described herein provide diodes and ways of forming diodes in CMOS integrated circuits having pre-amorphization implants (PAI), in which the end of range damage from the PAI is prevented from overlapping the depletion region at p-n junction of the diode. With such structure, a greater degree of ideality can be achieved. Moreover, in a particular embodiment described herein, the diode structure is fabricated without having to provide a separate masking step, such as to block the PAI from implanting the diode regions, while maintaining the implant in the remaining FET regions.

According to one embodiment of the invention, as shown in the sectional view of FIG. 2, a diode 100 is formed by a process by which a n-type field effect transistor ("NFET") 110 and a p-type field effect transistor ("PFET") 120 are simultaneously formed. Referring to FIG. 2, the diode, and the channel regions 111 and 121 of the NFET and the PFET, respectively, are provided in a single-crystal region 105 of a substrate. The substrate is preferably a semiconductor-on-insulator ("SOI") type substrate 128, in which the single-crystal region 105 overlies a buried oxide layer 130, and the buried oxide layer, in turn, overlies a bulk region 132 of the substrate. Preferably, the single-crystal region 105 of the substrate consists essentially of a first semiconductor such as silicon. In yet another alternative embodiment, the single-crystal semiconductor region can consist essentially of one III-V compound semiconductor, or a II-VI compound semiconductor. While embodiments of the invention can be practiced for all such alternatives, for ease of description, unless otherwise noted, further reference will be made only to embodiments in which the single-crystal semiconductor region consists essentially of silicon.

The diode 100 includes an n-doped cathode 102, which includes an n-doped well region or "n-well region" 104 forming the body of the cathode, and an n+ doped ohmic contact region 101, both the n-well region and the contact region being disposed in the single-crystal region 105 of silicon. The cathode 102 has an annular structure, having a ring-like pattern within the single-crystal silicon region 105 and extending in directions generally into and out of the sectional plane which is exposed in the view of FIG. 2. The anode of the diode is disposed as a cylindrical or frusto-conical body surrounded by the adjacent cathode 102. The anode includes two regions of the single-crystal silicon region 105, an implantation 108 and a second region 109, which is disposed laterally outside of the implantation 108. The implantation 108 has a cylindrical or frusto-conical shape and the second region has an annular shape. Illustratively, the implantation 108 consists essentially of silicon, having an implanted species such as silicon (Si), germanium (Ge), other Group IV element, or neutral species such as xenon (Xe), the implantation 108 having been formed by a pre-amorphization implant. The boundary of the implantation 108 of diode 100 within the single-crystal region 105 is shown at 140. This confines one lateral dimension of the implantation 108 to that shown at 146. At the boundary 140 of the implantation, significant end-of-range (EOR) defects appear in the crystal structure of the single-crystal silicon.

On the other hand, the boundary 142 of the cylindrical or frusto-conical anode is located at the p-n junction, that is, at the interface between the p-doped second region 109 of the anode and the n-well region 104 of the cathode. As the boundary 142 of the second region 109 is disposed outside the boundary 140 of the implantation 108, the cylindrical or frusto-conical p-n junction is disposed at a location that does not suffer from EOR defects in the silicon crystal caused by the pre-amorphization implant. In other words, the p-n junction located at the boundary 142 between the p-doped and n-doped regions of the single-crystal silicon region 105 does not suffer from crystal defects such as dislocations and the like, which exist primarily at the boundary 140 of the implantation 108 and the second region 109 which is predominantly silicon. In addition, the lateral dimension 147 of the anode is now much greater than the lateral dimension 146 of the implantation 108.

Moreover, because the p-n junction is now spaced from the boundary of the silicon germanium region 108, the characteristics of the diode are improved. A diode having better "ideality" is achieved. Thus, if the value "1.00" is considered to represent an ideal diode, then a diode having superior ideality, as achieved according to the embodiments of the invention, may have an ideality close to unity such as 1.03 or less. Moreover, in a distribution of diodes that are manufactured to have the above-described structure according to the processes described herein, much more diodes fall within the tolerances for "good ideality" and much fewer diodes are subject to being rejected for characteristics which fall outside of tolerances.

As further shown in FIG. 2, a gate conductor which includes a p+ doped region 148 and an n+ doped region 150 overlies the diode 100. The p+ and n+ doped gate conductor regions 148, 150 are disposed over the n-well region 104 of the substrate, separated therefrom by a gate dielectric 152. A pair of sidewall spacers 154 are disposed on sidewalls of the gate conductor, the spacers 154 preferably being symmetric, i.e., having the same width, regardless of whether the spacer is disposed on an inside edge 156 of a p+ doped gate conductor region or is disposed on an outside edge 158 of an n+ doped gate conductor region. As is further seen from FIG. 2, the boundary 142 of the p+ doped second region 109 of the single-crystal silicon region 105 is determined in relation to the outer edges 160 of the spacer 154.

The diode 100 is separated by an isolation region 170 from other areas of the substrate in which the NFET and the PFET are disposed. Preferably, the isolation region 170 is provided as a shallow trench isolation (STI) region which extends from a major surface 172 of the substrate to the buried oxide (BOX) layer 130 below the single-crystal silicon region 105. The STI region 170 preferably includes a relatively solid and thick mass of a dielectric material having a low or moderately low dielectric constant. For example, the STI region 170 may consist essentially of silicon dioxide. Optionally, the STI region may also include a lining, such as one including a barrier material, for example, silicon nitride.

As further shown in FIG. 2, the NFET 110 has a structure which includes a pair of n+ doped source/drain regions 112 which form p-n junctions with a channel region 111 disposed in a p-well 115 of the single-crystal region 105. The p-n junctions are disposed at locations which either underlie the spacers 114 disposed on sidewalls of an n+ doped gate conductor 116, or at locations which underlie the gate conductor 116. As shown in FIG. 2, the spacers 114 are relatively thin, having width which is preferably between about 10 nm and 30 nm.

The PFET 120 is separated from the NFET 110 by a second STI region 180. The PFET 120 has a similar structure, except that the channel region 121 of the PFET is disposed in a n-well 125, while the source/drain regions 122 are p+ doped, and the gate conductor 128 is p+ doped. Portions 124 of the source/drain regions 122 include implantations created by pre-amorphization implants during processing. The implantations are disposed at locations near edges 126 of the channel region 121 of the PFET such that end-of-range (EOR) defects at edges of the implantations provide a leakage path for the flow of charge carriers from the channel region 125 to the implantations, e.g., for counteracting the floating body effect of the otherwise isolated channel region 125.

Now that the structure of the diode 100 and NFET and PFET transistors provided in the same substrate have been described, a method of simultaneously fabricating the diode, the NFET and the PFET according to one embodiment will now be described, with reference to FIGS. 3 through 5. Such method is performed preferably using only two masks, two being the same number of masks which are required in any case to form both NFET and PFET devices in the single-crystal semiconductor region 105 (FIG. 2). According to this embodiment, the above-described structure of diode 100 is achieved with minimal burden or impact to process complexity and process window.

Accordingly, in a preliminary stage of fabrication according to an embodiment of the invention, a pre-amorphization implant is performed, which defines the location of the implantation 108 of the diode, as well as the location of the implantations 124 of the PFET. In this preliminary stage, the STI regions 170 and 180 have already been formed in the single-crystal silicon region 105. A gate stack 210 of the diode, and gate stacks 220 and 230 of that which will become the NFET and the PFET, respectively, are patterned. The diode includes a gate stack mainly in order that the NFET, PFET and diode can be formed simultaneously while sharing most, if not all of the fabrication steps of one unitary process sequence.

The gate stacks include a layer of polycrystalline semiconductor, e.g., polysilicon, and a gate dielectric, e.g., thermally grown silicon dioxide or silicon nitride, for example, after which relatively thick spacers 212 are formed on sidewalls of the gate stacks 210. The thick spacers can be formed, for example, by a conformal deposition of a dielectric material such as silicon nitride or silicon dioxide, to name just a few of many possible materials, followed by a vertically directed anisotropic etch such as a reactive ion etch (RIE). The RIE process is halted when an underlying etch stop material 214 is reached, e.g., a pad oxide, disposed on the major surface 172 of the single-crystal silicon region 105. Thereafter, as shown in FIG. 3, a temporary masking layer 206, such as a patterned photoresist (PR) layer or a patterned antireflective coating (ARC) layer is patterned to cover an area 202 of the single-crystal silicon region 105 from which the NFET will be formed, as well as areas 204 from which the cathode region of the diode will be formed. Thereafter, as indicated by arrows 218, an pre-amorphization implant (PAI) is performed to implant a species such as silicon, germanium, xenon, carbon into region 108 of the anode portion of that which will later become the diode and to implant the same species into regions 124 of what will later become the PFET. In a particular embodiment, the implanted species consists essentially of germanium (Ge), for example. In the case of the diode, the PAI produces an implantation 108 having a relatively small width 146, due to the presence of the spacers 212 during the PAI, the spacers 212 being relatively thick, and thus covering a larger area of the single-crystal silicon region 105 than the final relatively thin spacers 154 (FIG. 2). During this implanting step, the gate conductor 230 and portions 148 of the gate conductor 210 of the diode are implanted with Ge atoms, as well. In the case of the PFET, as described above, the implanted Ge atoms serve to control the floating body effect to improve the performance of the PFET. However, in the diode, the implantation 108 neither improves the performance nor significantly detracts from the diode's performance.

Figure 4:
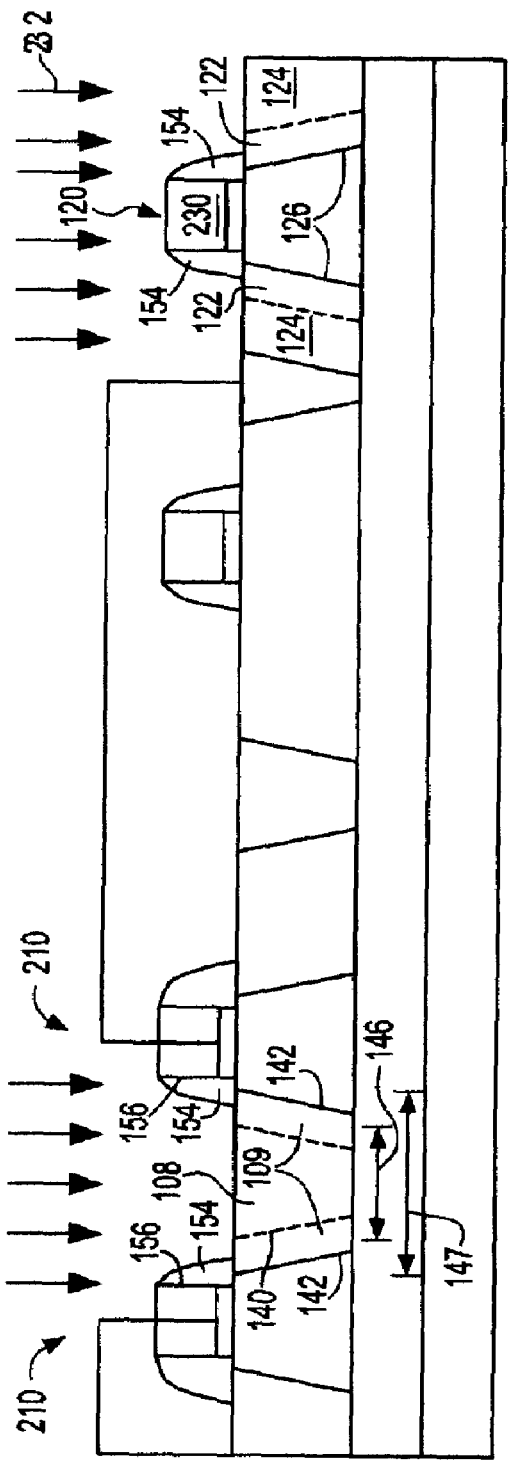

Turning now to FIG. 4, steps are performed to replace the thick spacers 212 (FIG. 3) that were used during the PAI with thin spacers. These steps are performed without the use of an additional masking layer. For that reason, when the thick spacers 212 (FIG. 3) are removed from the inner sidewalls 156 of the gate conductors of the diode, they are also removed from the sidewalls of the gate conductor 230. With the spacers removed, halo and extension implants are performed, as indicated by arrows 232. These implants define the edges of the p-n junctions in the PFET 120 which will ultimately remain under the final spacer which is formed thereafter.

Subsequently, the thin spacers 154 are formed on sidewalls of both the gate conductor 210 of the diode, and the gate conductor 230 of the PFET. Thereafter, an implanting step is performed to form the heavily doped p+ anode of the diode and simultaneously form the p+ source/drain regions 122 of the PFET. Because this implanting step is performed with only the thin spacers 154 in place, the edge 142 of the p+ implanted region 109 is spaced away from the edge 140 of the implantation 108 from the previous PAI. Hence, the p-doped implanted region 109 is spread over a larger lateral dimension 147 than the dimension 146 of only the PAI implantation 108. Similarly, in the PFET 120, the edges 126 of the p+ doped source/drain regions 122 are spaced apart from the edges of the implantations 124 remaining from the PAI.

Figure 5:
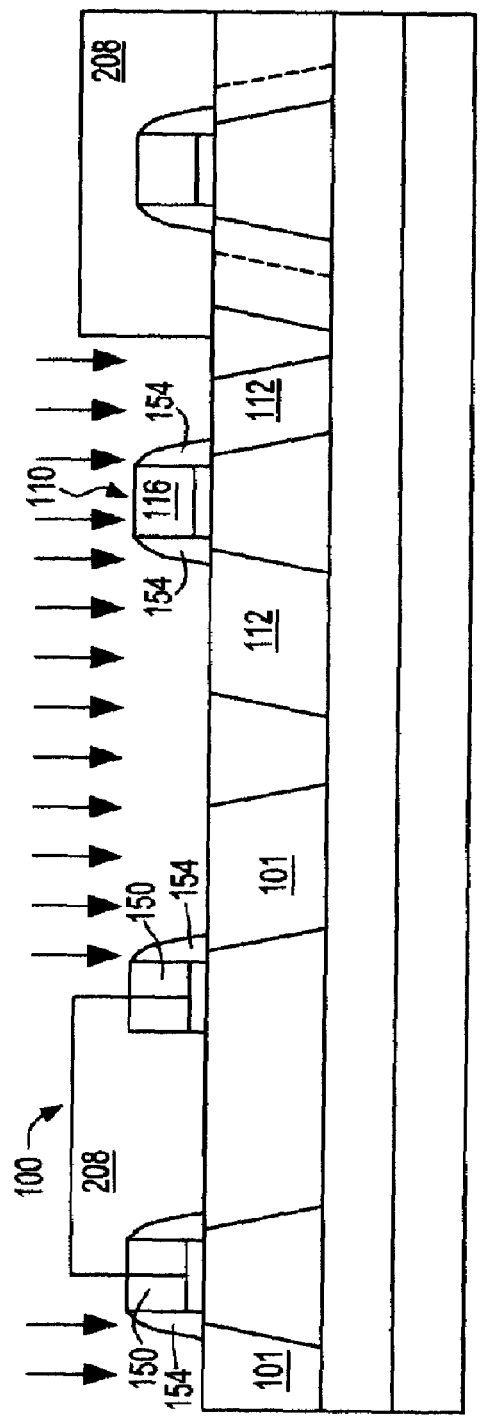
Figure 6:
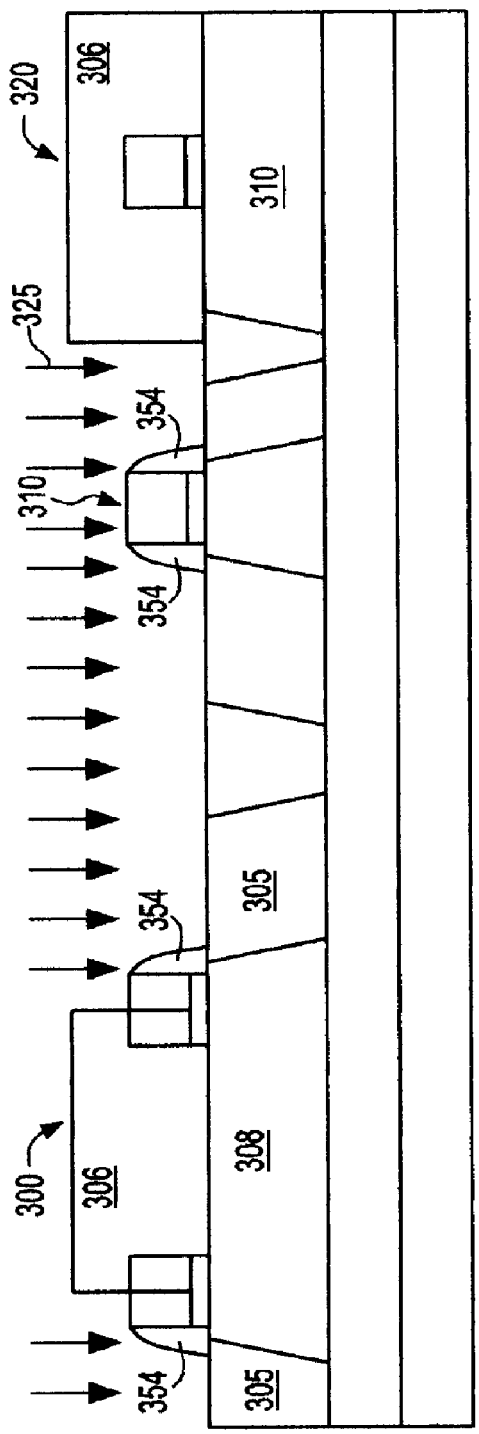

As further shown in FIG. 5, in subsequent processing, the masking layer 206 (FIG. 3) is removed, and a second masking layer 208 is deposited and patterned. The second masking layer is preferably patterned to be the inverse of the first masking layer 206. With the second masking layer in place, further steps are performed to implant the annular n+ doped contact region 101 of the diode 100 and to perform halo and extension implants and source/drain implants for the NFET 110. After the second masking layer 208 is patterned, the remaining thick spacers 212 (FIG. 3) are removed, after which the halo and extension implants are performed. Subsequently, steps are performed to form the final thin spacers 154 on sidewalls of the gate conductor 116 of the NFET and on the outer sidewalls of gate conductor regions 150 of the diode. Thereafter, an n-type dopant is implanted to a high concentration to implant the source/drain regions 112 of the NFET while simultaneously implanting the n+ contact region 101 of the diode 100.

Subsequently, the masking layer 208 is removed, after which further fabrication steps are performed. The substrate is placed in an oven and a "dopant drive-in anneal" is performed by heating the substrate to a moderate or high temperature. During this step, the dopants in the implanted source/drain regions are incorporated into the crystal structure, while diffusing somewhat in lateral directions. Steps are also performed to form conductive interconnections to the diode and to the NFET and the PFET. These steps include forming a dielectric region 190 as an interlevel dielectric region overlying the diode, the NFET and PFET, after which conductive vias 192 are formed, by etching contact holes in the dielectric region 190 and filling the contact holes with a conductive material such as a metal and/or silicide. As further shown in FIG. 2, some of the conductive vias 192 are conductively connected to others of the conductive vias, as by interconnects 194 which run in a lateral, horizontal direction above the conductive vias.

The above-described method illustrated in FIGS. 2–5 is one embodiment for fabricating the diode, NFET and PFET according to the present invention. In another embodiment, illustrated in FIGS. 6 through 9, the fabrication method is similar to that shown and described above, except that the masking layers and the spacers are formed and used in a different order. In this embodiment, a masking layer 306 is deposited and patterned to cover the region which will become the PFET and the anode 308 of the diode 300. Thereafter, halo and extension implants are performed to the NFET. Thin spacers 354 are then formed on sidewalls of the exposed gate conductor structures. An implantation is then performed, as indicated by arrows 325 to implant the n+ doped source/drain regions of the NFET 310 and the n+ doped contact region 305 of the diode 300.

Figure 7:
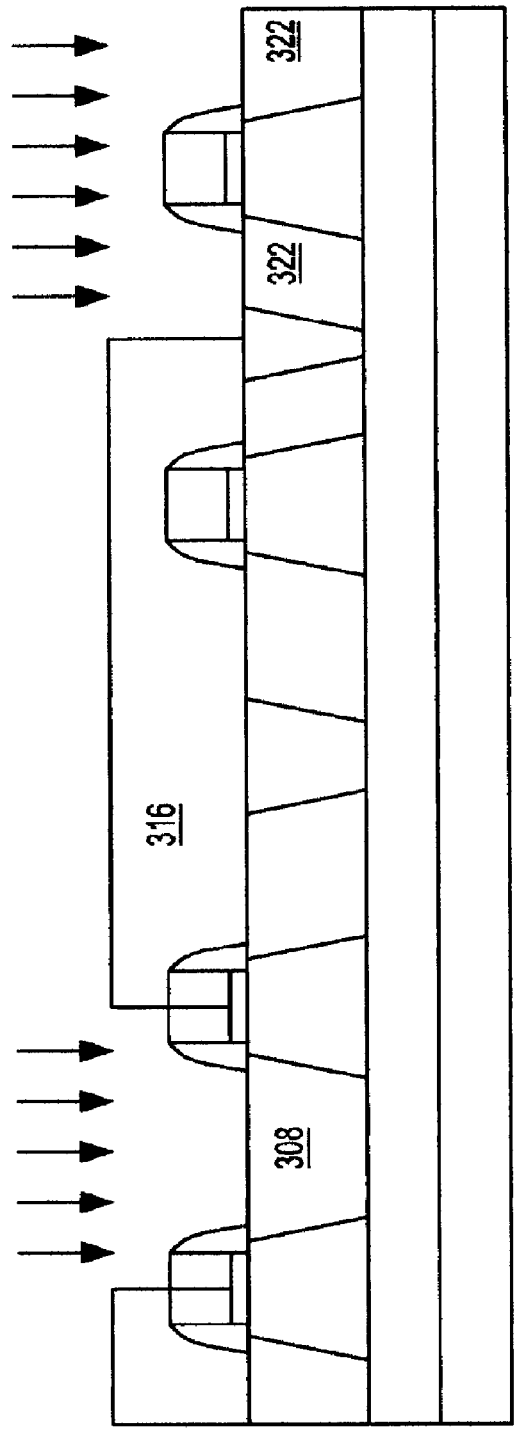

FIG. 7 illustrates a second stage in the fabrication of a diode and corresponding NFET and PFET transistors in the substrate. As shown therein, the masking layer 306 is now removed and a new masking layer 316, appearing as substantially the inverse of the first masking layer 306, is patterned to cover the contact region of the diode and the NFET generally, while exposing the anode region of the diode as well as the PFET. Subsequently, the p+ doped implantation of the anode in region 308 is performed simultaneously with the implantation of p+ doped source/drain regions 322 of the PFET.

Thereafter, as shown in FIG. 8, the thin spacers are removed from sidewalls of the exposed gate conductor of the PFET 320 and from the inner sidewalls 309 of the gate conductor of the diode 300. Halo and extension implants are now performed to the PFET. Thereafter, thick spacers 370 are then formed in place of the thin spacers. Subsequently, a PAI is performed, using a species such as Si, Ge, Xe, for example, and preferably using germanium atoms. The PAI is performed into the source/drain regions 372 of the PFET 320. Simultaneously, the PAI is performed into the exposed portion of the anode to form a PAI implantation 378. Because of the thicker spacers 370 that are used when the PAI is performed, the implantation 378 has a smaller lateral dimension 380 than the entire lateral dimension 382 of the anode 308.

Thereafter, referring to FIG. 9, the second masking layer 316 is removed and a dopant drive-in anneal is performed, which establishes the locations of the edges of the anode region 308 and that of the implantation 378 of the diode 300, as well as the edges of the source/drain regions 322 and the PAI implantations 372 of the PFET 320. In addition, further processing to provide an interlevel dielectric and conductive vias contacting the diode and FETs is performed, as described above with reference to FIG. 1.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A device, comprising:
   a single-crystal semiconductor region disposed in a substrate;
   a diode disposed in said single-crystal semiconductor region, said diode including:
      an anode region including a first portion of said single-crystal semiconductor region and a second portion of said single-crystal semiconductor region sharing a common inner boundary with said first portion, said second portion of said anode region having an outer boundary spaced apart from said inner boundary, said single-crystal semiconductor region exhibiting significant crystal defects at said inner boundary and not exhibiting significant crystal defects at said outer boundary; and
      a cathode region adjoining said outer boundary of said anode region to provide a p-n junction with said second portion, such that said p-n junction is spaced apart from said significant crystal defects at said inner boundary.

2. The device as claimed in claim 1, wherein said cathode region is disposed in an n-well of said single-crystal semiconductor region and said anode region is counter-doped with a p-type dopant.

3. The device as claimed in claim 1, wherein said second portion of said anode region consists essentially of silicon and is essentially free of germanium, and said first portion of said anode region consists essentially of silicon and germanium.

4. The device as claimed in claim 1, further comprising a gate stack including a gate conductor and a gate dielectric, said gate stack overlying said cathode region, said gate stack further including spacers disposed on sidewalls of said gate conductor, said spacers overlying at least a portion of said anode region.

* * * * *